(12) United States Patent
Moriguchi

(10) Patent No.: US 6,784,537 B2
(45) Date of Patent: Aug. 31, 2004

(54) SEMICONDUCTOR DEVICE OF SURFACE-MOUNTING TYPE

(75) Inventor: Koji Moriguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/237,689

(22) Filed: Sep. 10, 2002

(65) Prior Publication Data

US 2003/0052405 A1 Mar. 20, 2003

(30) Foreign Application Priority Data

Sep. 11, 2001 (JP) .................................. 2001-274504

(51) Int. Cl.⁷ .............................................. H01L 23/34
(52) U.S. Cl. .................... 257/706; 257/675; 257/707; 257/708; 257/710
(58) Field of Search ....................... 257/706, 675, 257/707, 712

(56) References Cited

U.S. PATENT DOCUMENTS 6,075,289 A * 6/2000 Distefano .................. 257/732
6,114,755 A * 9/2000 Ito et al. ...................... 257/675
6,215,180 B1 * 4/2001 Chen et al. .................. 257/720
6,246,114 B1 6/2001 Takahashi et al.
6,410,977 B1 * 6/2002 Hashimoto .................. 257/673
6,462,405 B1 * 10/2002 Lai et al. ...................... 257/675
6,534,859 B1 * 3/2003 Shim et al. .................. 257/706
2001/0019181 A1 * 9/2001 Lee et al. .................... 257/796
2002/0109219 A1 * 8/2002 Yang et al. .................. 257/712

* cited by examiner

Primary Examiner—Wael Fahmy
Assistant Examiner—Nathan W. Ha
(74) Attorney, Agent, or Firm—Oblon, Spivak, McClelland, Maier & Neustadt, P.C.

(57) ABSTRACT

A semiconductor device of a surface-mounting type has a mount surface and includes a semiconductor chip having a first surface, a second surface, a heat-generating portion located nearer to the second surface than the first surface and that generates heat during operation, and at least one patterned electrode formed on the second surface. A resin covers the semiconductor chip and an electrode terminal is extracted from the first surface of the semiconductor chip. A mounting face of the electrode terminal and a surface of the at least one patterned electrode are exposed to be substantially flush with a plane of the mount surface, and a perimeter of the at least one patterned electrode is surrounded by the resin.

18 Claims, 11 Drawing Sheets

20A,20B    12

20A,20B    12

20A,20B    12

20A, 20B        12

20A, 20B        12

20A, 20B        12

SEMICONDUCTOR DEVICE OF SURFACE-MOUNTING TYPE

CROSS-REFERENCE TO RELATED APPLICATIONS

This application is based upon and claims the benefit of priority from the prior Japanese Patent Application No. 2001-274504, filed on Sep. 11, 2001; the entire contents of which are incorporated herein by reference.

BACKGROUND OF THE INVENTION

This invention relates to a semiconductor device. More particularly, it relates to a semiconductor device having a package structure of a surface-mounting type and especially suitable for carrying so-called power semiconductors such as power transistors and rectifier elements, for example.

Surface-mounting semiconductor devices have various advantages. One of the advantages is reliable, easy mounting on a mounting substrate having formed an electrode pattern by a process such as solder reflow technique or solder flow technique. Others are compactness, light weight, high reliability, and so on.

FIG. 11 is a schematic diagram showing a cross-sectional structure of a conventional surface-mounting semiconductor device of a resin-molded type.

FIG. 12 is a schematic diagram of the semiconductor device, viewed from its bottom.

The semiconductor device shown in FIGS. 11 and 12 has a package structure often called "flat package". A first lead frame 104 is connected on the upper surface of a semiconductor chip 102 by a bonding material 108 such as solder. A second lead frame 106 is connected to the bottom surface of the semiconductor chip 102 by a bonding material 110. These elements are sealed altogether by a resin 112 such as epoxy or silicone.

As shown in FIG. 12, outer lead portions of lead frames 104, 106 extend from the bottom surface of the semiconductor device to be connected to a mounting substrate not shown.

In case of this structure, thickness T of the package is the total thickness of those and other elements, namely, (upper resin layer 112A)+(first lead frame 104)+(bonding material 108)+semiconductor chip 102)+(bonding material 110)+(second lead frame 106)+(lower resin layer 112B). Therefore, there is a limit for thinning the thickness T of the package.

In addition, since the lower surface of the second lead frame 106 is covered by the resin layer 112B that is relatively low in heat conductivity, capability of dissipating heat generated from the semiconductor chip 102 during powered operation is inevitably limitative.

SUMMARY OF THE INVENTION

According to an embodiment of the invention, there is provided a semiconductor device of a surface-mounting type having a mount surface to be joined with a mounting substrate, comprising: a semiconductor chip having a bottom surface, a top surface, a heat-generating portion located nearer to said top surface than said bottom surface and generating heat during operation, and at least one patterned electrode formed on said top surface; a resin provided to cover said semiconductor chip; and an electrode terminal extracted from said bottom surface of said semiconductor chip, a mounting face of an electrode terminal and a surface of said patterned electrode being exposed on said mount surface to be substantially flush with a plane of said mount surface, and a perimeter of said patterned electrode being surrounded by said resin on said mount surface.

According to another embodiment of the invention, there is provided a semiconductor device of a surface-mounting type having a mount surface to be joined with a mounting substrate, comprising: a lead frame; a semiconductor chip bonded said lead frame, and having at least one electrode smaller than said semiconductor chip; and a resin provided to cover said semiconductor chip, a mounting face of said lead frame and a surface of the electrode being exposed on said mount surface to be flush with a plane of said mount surface, and a perimeter of said electrode being surrounded by said resin on said mount surface.

According to yet another embodiment of the invention, there is provided a semiconductor device comprising: a lead frame having a bonding portion and an electrode terminal; a semiconductor chip having a top surface, a bottom surface, and at least one patterned electrode formed on said top surface, said bottom surface being bonded to said bonding portion of said lead frame; and a resin provided to cover said semiconductor chip, a mounting face of said electrode terminal of said lead frame being provided to be substantially flush with a surface of said patterned electrode, the surface of said patterned electrode being exposed to said top surface of said semiconductor chip, and a perimeter of said surface of said patterned electrode being covered by said resin.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Explanation is now be made below with reference to the drawings about semiconductor devices the Inventor examined in the course toward the present invention and semiconductor devices according to embodiments of the invention.

Figure 11:
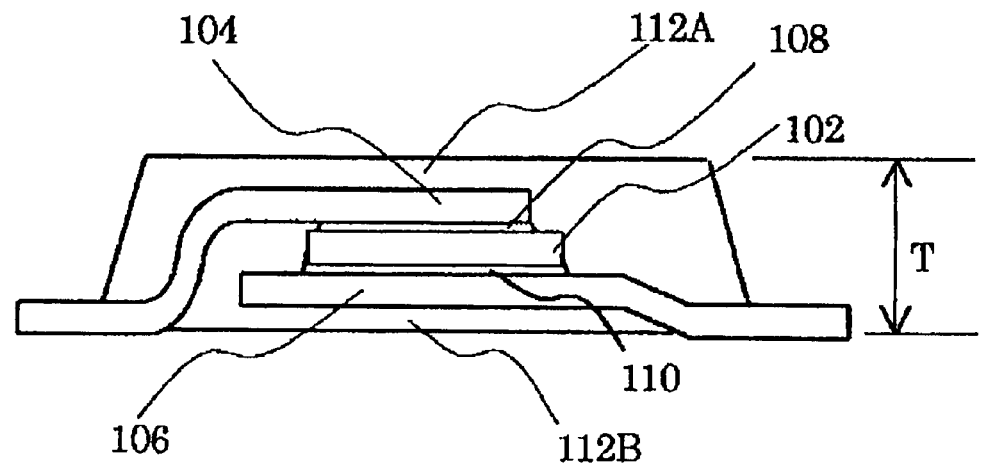
FIG. 11 is a schematic diagram showing a cross-sectional structure of a conventional surface-mounting semiconductor device of a resin-molded type.
Figure 12:
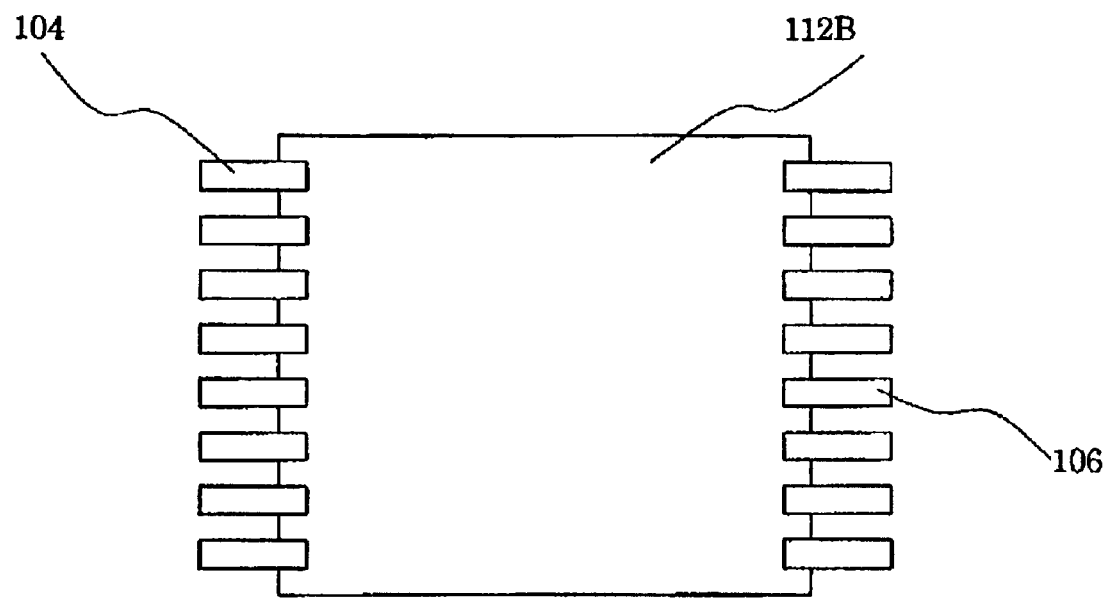
FIG. 12 is a schematic diagram of the semiconductor device of FIG. 11, viewed from its bottom.

For the purpose of improving the limit of the package thickness and heat dissipation capability that are problems involved in the conventional technique shown in FIGS. 11 and 12, a new structure is considered.

Figure 13:
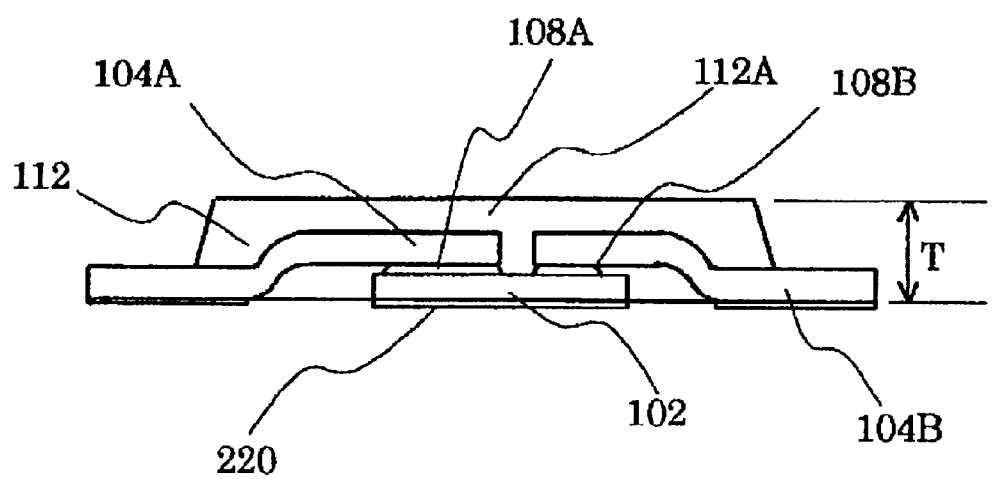
FIG. 13 is a schematic diagram showing a cross-sectional structure of a surface-mounting semiconductor device of a resin-molded type the Inventor examined in the course toward the present invention.

FIG. 13 is a schematic diagram showing a cross-sectional structure of a surface-mounting semiconductor device of a resin-molded type the Inventor examined in the course toward the present invention.

Figure 14:
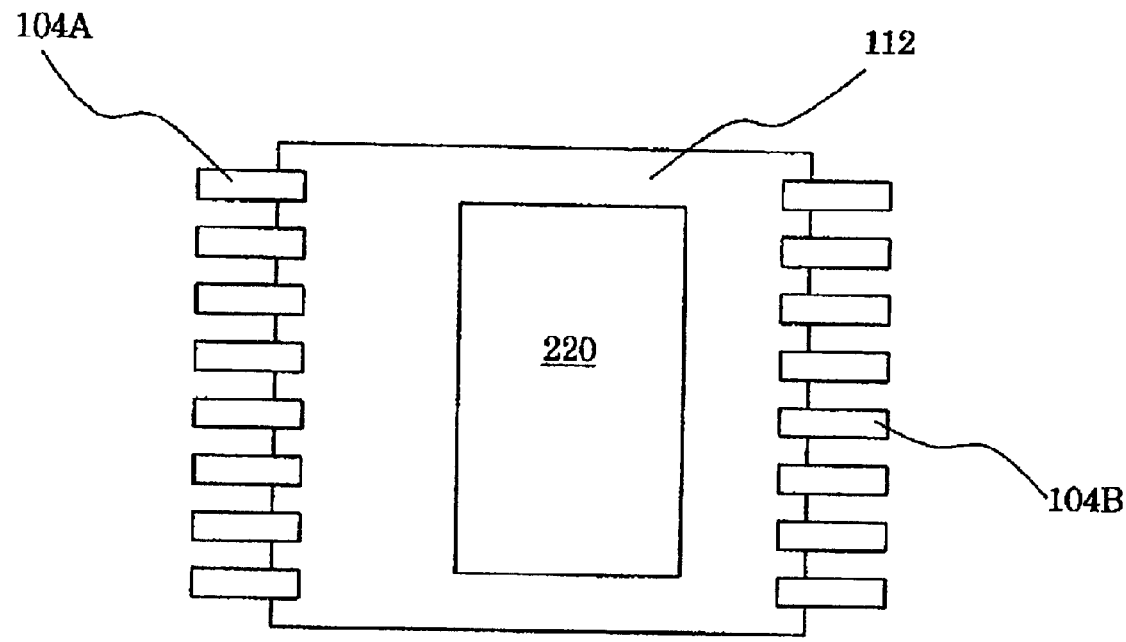
FIG. 14 is a schematic diagram of the semiconductor device of FIG. 13, viewed from its bottom.

FIG. 14 is a schematic diagram of the semiconductor device of FIG. 13, viewed from its bottom.

In this semiconductor device, a first lead frame 104A and a second lead frame 104B are connected on the upper surface of a semiconductor chip 102 by bonding materials 108A, 108B such as solder. Then these components are sealed altogether by a resin 112. However, on the bottom surface of the semiconductor chip 102, a metal layer (solder layer, for example) 220 is formed over the entire area, and the resin 112 leaves the metal layer 220 exposed on the bottom surface as shown in FIG. 14 as well. When the semiconductor device is mounted on a mounting substrate, the metal layer 220 will be connected to a conductor land of the substrate.

In this structure, the package thickness T is the total of thicknesses of some components, namely, (upper resin layer 112A)+(lead frames 104A, 104B)+(bonding materials 108A, 108B)+semiconductor chip 102)+(metal layer 220). That is, the element can be thinned as compared with the first embodiment. In addition, without the resin under the semiconductor 102, this element is excellent in heat-dissipation capability as well.

Recently, further space saving is requested to semiconductor devices used for power control, such as power transistors, IGBT (insulated gate bipolar transistor) and various kinds of thyristors. Examples of these semiconductor devices are power MOSFET (metal-oxide-semiconductor field effect transistor) and diodes used as power circuits of portable phones, notebook personal computers, etc., and IGBT used as electric flash circuits of cameras among others.

However, through trials and researches, the Inventor found two problems that may occur when applying the structure shown in FIGS. 13 and 14 to those semiconductor devices.

One of them is insufficient heat dissipation. This is related to heat-generating sites in the semiconductor chip 102.

Figure 15:
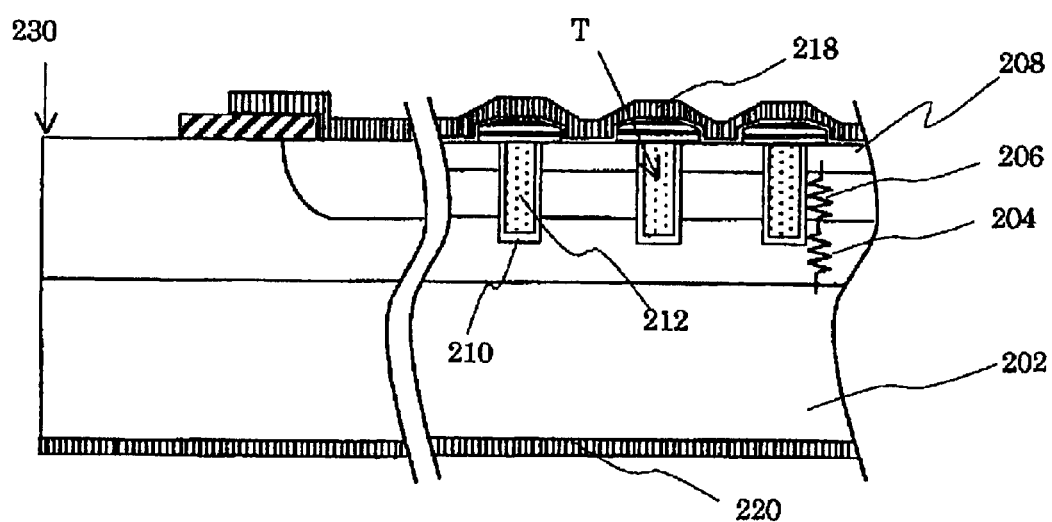
FIG. 15 is a schematic diagram showing a cross-sectional structure of the substantial part of power MOSFET as an example of semiconductor chips 102.

FIG. 15 is a schematic diagram showing a cross-sectional structure of the substantial part of power MOSFET as an example of semiconductor chips 102.

The structure shown here is called a "vertical structure" that is typical as power MOSFET. Its substantial part is roughly explained below.

On a high-concentrated semiconductor substrate 202, a high-resistance layer 204 is formed. Sequentially deposited thereon are a low-concentrated channel layer (often called "base layer") 206 and a high-concentrated source layer 208. With this multi-layered structure, a trench T is formed from the top surface, a gate insulating film 210 is deposited to cover the inner walls of the trench, and a gate electrode 212 buries the trench T. Then a source electrode 218 is formed on the source layer 208, and a drain electrode 220 is formed on the bottom surface of the substrate 202. Also for the gate electrode 212, a connecting electrode is provided on the top surface of the semiconductor chip 102 through a wiring path not shown.

In case this type of power MOSFET is applied to the semiconductor device shown in FIGS. 13, 14, the source electrode and the gate electrode are connected to the lead frames 104A, 104B, respectively, and the drain electrode 220 underlying the entire bottom surface of the chip is directly connected to the mounting substrate.

However, main heat-generating sites in the power MOSFET are the high-resistance layer 204 and the channel layer 206 as schematically shown in FIG. 15. That is, heat is generated near the top surface of the chip 102. Therefore, in case this chip is mounted on a semiconductor device shown in FIGS. 13, 14, the heat generated near the top surface of the chip 102 cannot be released to the mounting substrate unless it is transported to the bottom surface of the chip through the thick substrate 202. Therefore, this structure is inefficient and insufficient in heat dissipation capability.

The same problem is not limited to power MOSFET, and also material to a lot of semiconductor devices for powering or electrical control purposes. This is because almost all semiconductor chips mounted on these semiconductor devices have device regions on top surfaces of silicon substrates, a plurality of electrodes are accordingly formed on top surface regions, and heat is generated on the top surface regions.

That is, if the semiconductor chip is mounted on the semiconductor device shown in FIGS. 13, 14, then the top surface region of the chip having formed a plurality of electrodes and generating heat is connected to the lead frames 104A, 104B. Therefore, its capability of radiating heat generated in the top surface region is insufficient.

The second problem in conjunction with the semiconductor device shown in FIGS. 13, 14 is an issue of reliability. That is, in the structure shown in FIGS. 13, 14, moisture and humidity are liable to intrude from side surfaces of the semiconductor chip 102.

Figure 16A:
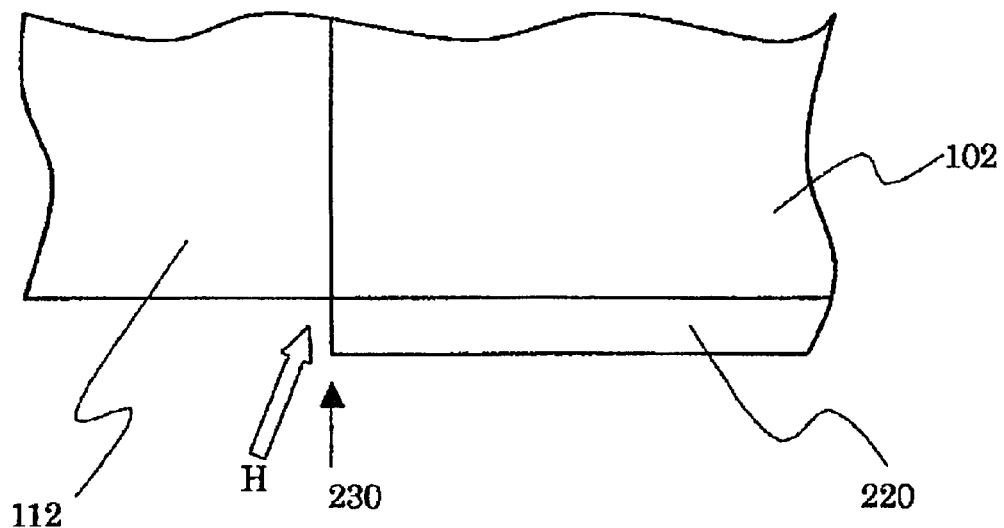
FIGS. 16A and 16B are schematic diagrams showing, in an enlarged scale, a cross-sectional structure of a part near one end of the chip 102 in the semiconductor device shown in FIGS. 13 and 14.
Figure 16B:
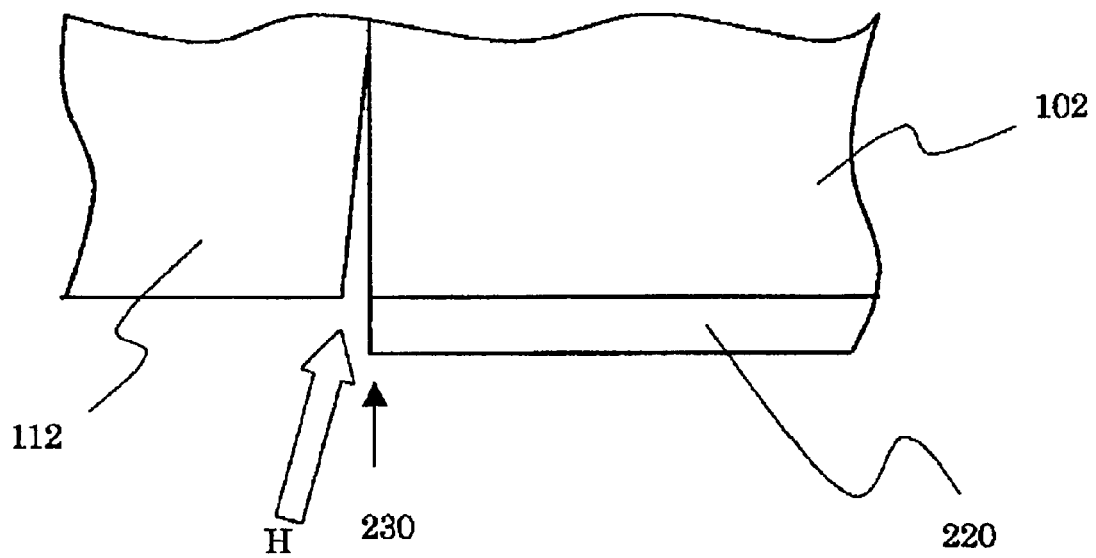

FIGS. 16A and 16B are schematic diagrams showing, in an enlarged scale, a cross-sectional structure of a part near one end of the chip 102 in the semiconductor device shown in FIGS. 13 and 14. As shown in FIG. 16A, an end-cut side surface 230 of the chip 102 extends substantially vertically to the chip substrate plane, and the resin layer 112 is buries adjacent to the side surface 230. Thus, humidity and moisture H are liable to intrude into the boundary portion between the chip side surface 230 and the resin layer 112, and thereby raise the probability of deterioration of the semiconductor device.

In addition, since the chip 102 and the resin layer 112 are under simple face-to-face engagement, "gaps" are liable to appear due to a difference between their thermal expansion coefficients, mechanical impulse, aging, or the like, as shown in FIG. 6B. These gaps allow easy intrusion of moisture and humidity down into the inside of the semiconductor device, and may invite deterioration of operations and malfunctions of the device.

Figure 17:
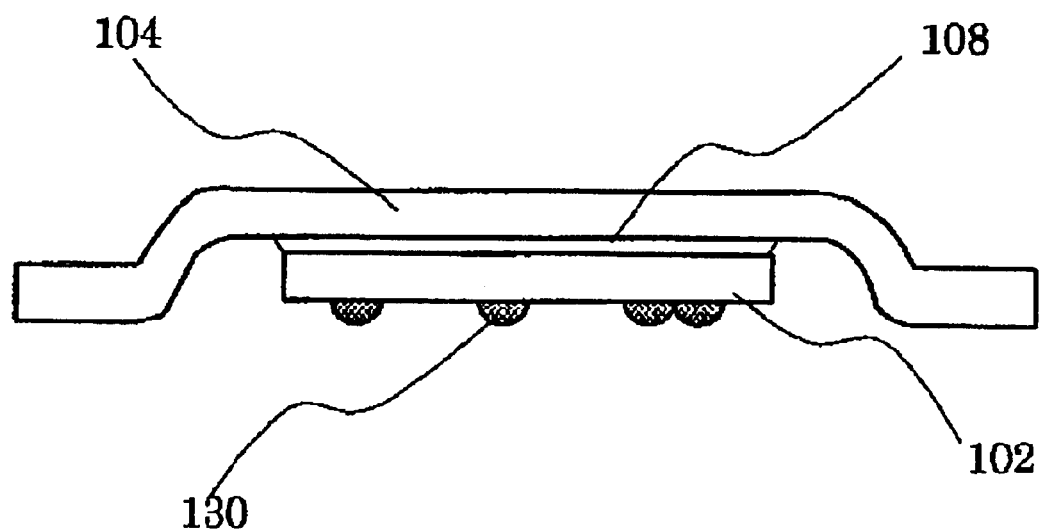
FIG. 17 is a schematic diagram showing a cross-sectional structure of a semiconductor device having a BGA structure.
Figure 18:
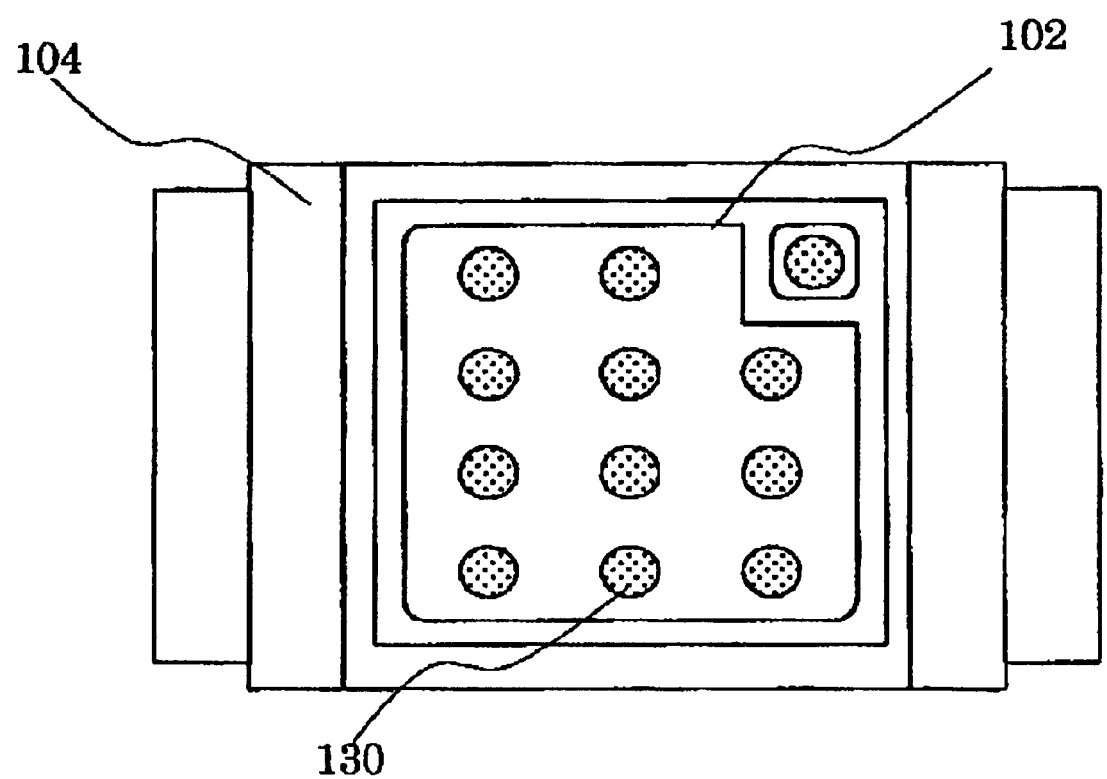
FIG. 18 is a schematic diagram of the semiconductor device of FIG. 17, viewed from its bottom.

On the other hand, there is a recent proposal of a semiconductor device having a BGA (ball grid array)-structured package as shown in FIGS. 17 and 18. This structure is certainly excellent from the viewpoints of thinning, miniaturization and heat dissipation. However, since the chip 102 is not sealed airtightly, there is the possibility of an increase of the leak current caused by adhesion of external moisture and contaminant to the semiconductor chip. This defect is similarly involved in a semiconductor device having a CSP (chip scale package) structure.

The present invention has been made under recognition of these problems, and intends to provide a semiconductor device excellent in heat dissipation capability, compact, thin and excellent in reliability as well.

Figure 1:
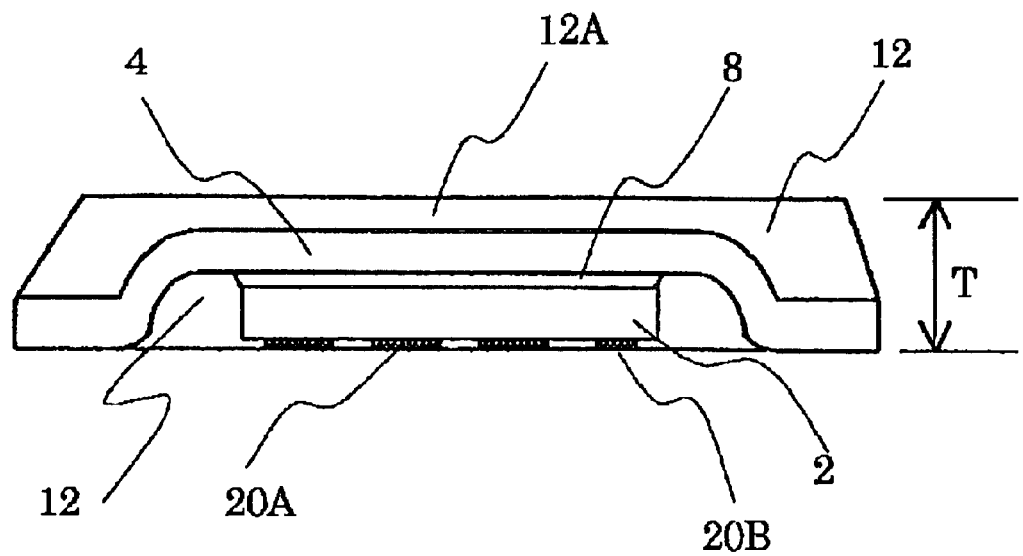
FIG. 1 is a schematic diagram showing a cross-sectional structure of a surface-mounting type semiconductor device according to an embodiment of the invention.

FIG. 1 is a schematic diagram showing a cross-sectional structure of a surface-mounting type semiconductor device according to an embodiment of the invention.

Figure 2:
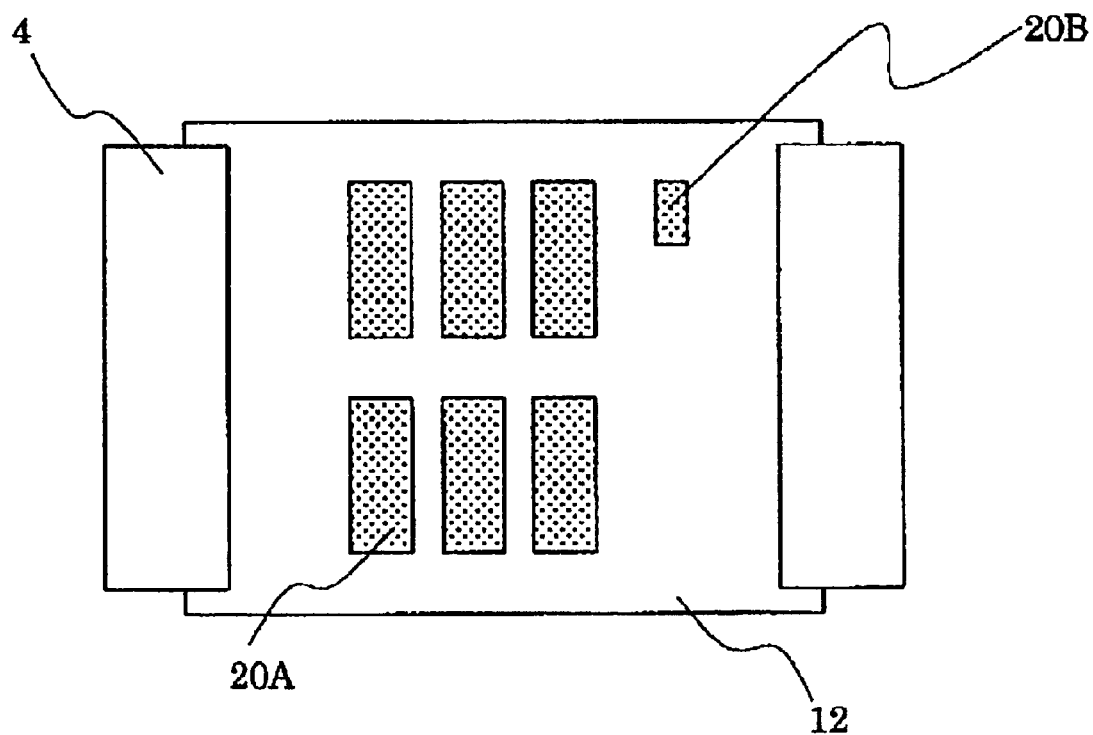
FIG. 2 is a schematic diagram of the semiconductor device, viewed from its bottom.

FIG. 2 is a schematic diagram of the semiconductor device, viewed from its bottom.

In the semiconductor device according to this embodiment, a lead frame 4 is connected on the top surface of the semiconductor chip 2 by bonding material 8 such as solder, and a plurality of electrodes 20A, 20B are formed on the lower (bottom) surface of the semiconductor chip 2. The semiconductor device is sealed by a resin 12 such as epoxy or silicone such that the semiconductor chip 2 and an inner part of the lead frame 4 are covered. On the bottom surface of the semiconductor device, the surface of the resin 12 is approximately flush with surfaces of the lead frame 4 and the electrodes 20A, 20B. That is, on the bottom surface of the semiconductor device, the bottom surface of outer lead portions of the lead frame 4 and bottom surfaces of electrodes 20A, 20B are exposed for connection to a conductor land (mount surface) of the mounting substrate not shown. Then the perimeter of these electrodes 20A and 20B is covered by the resin 12.

In case of the semiconductor according to the embodiment, thickness T of the package is the total of thicknesses of stacked components, namely, (upper resin layer 12A)+(lead frame 4)+(bonding material 8)+(semiconductor chip 2)+(electrode 20). That is, thickness T of the package can be reduced similarly to the semiconductor device shown in FIGS. 13, 14.

Actually, when a power MOSFET or IGBT for example as shown in FIG. 15 was mounted, thickness T of the package could be reduced down to about 0.5 mm.

Furthermore, the embodiment can ensure efficient release of heat because the electrodes 20A, 20B of the chip 2 are located on the bottom surface nearer to the mounting substrate. That is, as already explained in conjunction with FIG. 15, in almost all cases, generation of heat in the semiconductor chip 2 occurs near the surface closest to the electrodes. Therefore, when the chip 2 is mounted such that the electrodes 20A, 20B face on the bottom (face to the mounting substrate) as shown in FIG. 1, heat in the chip is sufficiently radiated to the mounting substrate.

For example, in case the power MOSFET of FIG. 15 is used in the embodiment of the invention, it will be located upside down in the semiconductor device of FIG. 1. That is, the drain electrode 220 formed on the bottom surface of the silicon substrate 202 (FIG. 15) will be connected to the lead frame 4 above it (in FIG. 1) whereas the gate electrode 212 and the source electrode 218 will be exposed to the bottom of the device as the electrodes 20A and 20B (in FIG. 1). In this manner, heat generated near the top surface of the power MOSFET in FIG. 15 will be released very efficiently via the electrodes 20A (source electrode) and the electrode 20B (drain electrode) to the mounting substrate.

Furthermore, the instant embodiment can improve the reliability as well by specifically shaping the joint interface between the electrodes 20A, 20B and the resin 12.

FIGS. 3A through 3F are schematic diagrams showing some cross-sectional structures of a region including a bottom electrode of a semiconductor device according to the embodiment. That is, this embodiment is directed to improving the reliability of the semiconductor device by shaping the joint interface between the electrodes 20A, 20B and the resin 11 around them into a "curve" or a "stepwise level difference" and thereby minimizing intrusion of humidity and moisture through the interface.

Figure 3A:
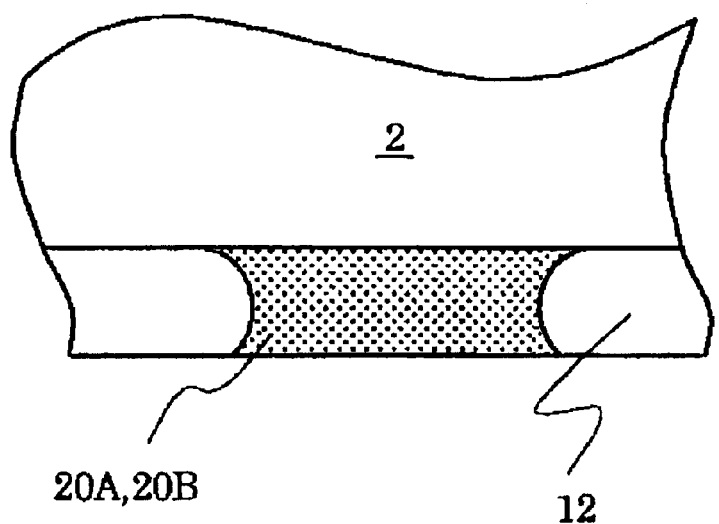
FIGS. 3A through 3F are schematic diagrams showing some cross-sectional structures of a region including a bottom electrode of a semiconductor device according to the embodiment.

In the version of FIG. 3A, the interface between the electrodes 20A, 20B and the resin 12 is shaped as a curved plane that is convex into the electrodes. In this manner, "engagement" of the resin 12 with the electrodes 20A, 20B is improved, and undesirable "separation" or "breaching" at the interface is less likely to occur. Therefore, the semiconductor device remains highly reliable even against temperature changes, vibrations or mechanical impulses. Simultaneously, the curved shape of the interface elongates the path for external humidity or moisture to intrude through the interface, and this also contributes to improvement of the humidity-proof capability of the device.

The curved shape shown in FIG. 3A can be made by wet etching, for example. That is, for manufacturing the semiconductor chip 2, patterning of the metal electrodes 20A, 20B is carried out. More specifically, after a metal layer of, for example, aluminum (Al) or copper (Cu) is formed to a thickness around 20 μm is formed as the electrodes 20A, 20B on a surface of a semiconductor, through coating of a photosensitive resist, exposure via a predetermined mask and development, a resist mask is formed. Thereafter, exposed part of the metal film is etched. In this etching, however, wet etching by an appropriate etching liquid is used instead of anisotropic etching such as RIE (reactive ion etching) or ion milling. Then the curved shape shown in FIG. 3 is obtained. The curved shape can be formed also by isotropic CDE (chemical dry etching).

Then by assembling the semiconductor chip having the electrodes 20A, 20B patterned in this manner on the semiconductor device shown in FIGS. 1 and 2, the semiconductor device having the resin 12 in engagement with the electrodes 20A, 20B with a curved edge as shown in FIG. 3A can be obtained.

Figure 3B:
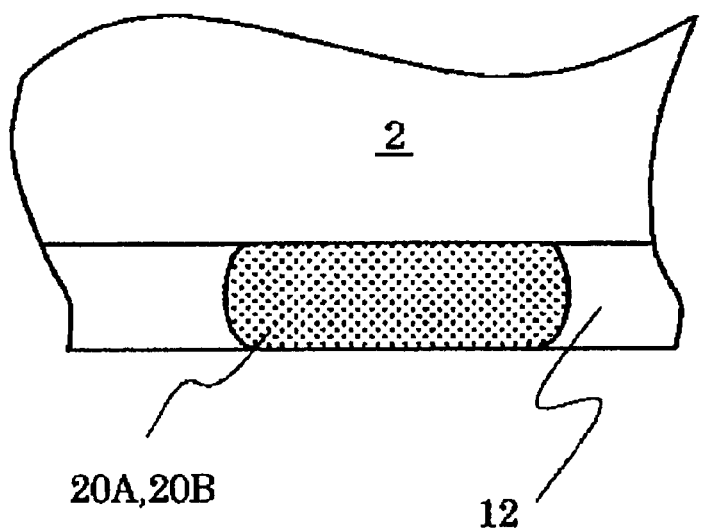

In the version shown in FIG. 3B, the joint interface between the electrodes 20A, 20B and the resin 12 is curved to be convex into the resin 12. This shape of the interface also improves "engagement" of the resin 12 to the electrodes 20A, 20B similarly to the foregoing version. Therefore, "separation" or "breaching" at the interface is less likely to occur. Therefore, the semiconductor device remains highly reliable even against temperature changes, vibrations or mechanical impulses. Simultaneously, the curved shape of the interface elongates the path for external humidity or moisture to intrude through the interface, and this also contributes to improvement of the humidity-proof capability of the device.

Here again, the curved shape can be formed by wet etching technique.

Figure 3C:
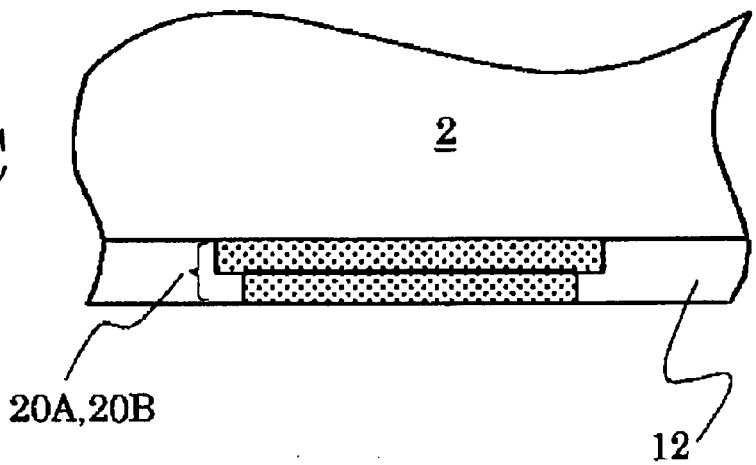

In the version shown in FIG. 3C, the joint interface between the electrodes 20A, 20B and the resin 12 has a "stepwise level difference". Also this "stepwise level difference" improved the "engagement" of the resin 12 with the electrodes 20A, 20B similarly to the foregoing versions, and undesirable "separation" or "breaching" at the interface is less likely to occur.

This kind of stepwise shape can be made by forming the electrodes 20A, 20B as a multi-layered film and etching them under conditions different in etching speed. For example, by depositing an aluminum layer and a copper layer in this order on a semiconductor and patterning the electrodes 20A, 20B under conditions higher in etching speed for the copper layer and lower in etching speed for the aluminum layer, the stepwise shape as shown in FIG. 3C can be obtained. The multi-layered structure and etching conditions employed here can be selected from various combinations while ensuring that the etching speed of the upper metal layer (remoter from the semiconductor) is higher than that of the lower metal layer (nearer to the semiconductor). In this case, therefore, dry etching such as CDE (chemical dry etching) is also usable.

Figure 3D:
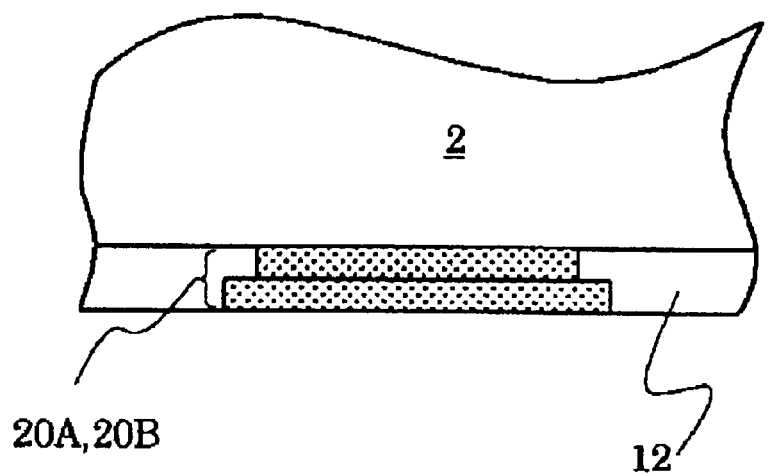

Also in the version of FIG. 3D, the joint interface between the electrodes 20A, 20B and the resin 12 has a "stepwise level difference". In this version, however, the end facet of the lower layer (nearer to the semiconductor) stays back from the end facet of the upper layer (remoter from the semiconductor).

This shape of the interface also improves "engagement" of the resin 12 to the electrodes 20A, 20B similarly to the foregoing versions. Especially in this specific example, the resin 12 can be formed to bite into the depressed region of the lower layer of the electrodes 20A, 20B, firmer "engagement" of the resin is ensured.

This stepwise shape of this specific example can be made by using a layer having a higher etching speed as the lower layer and using the technique similar to that of FIG. 3C.

Figure 3E:
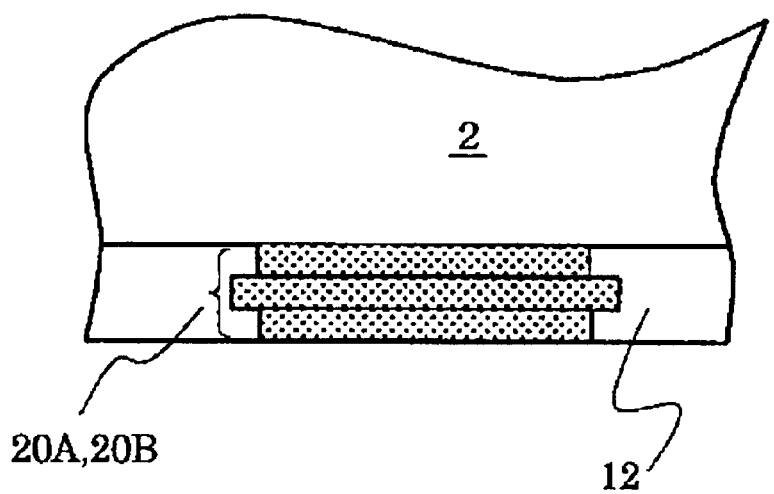
Figure 3F:
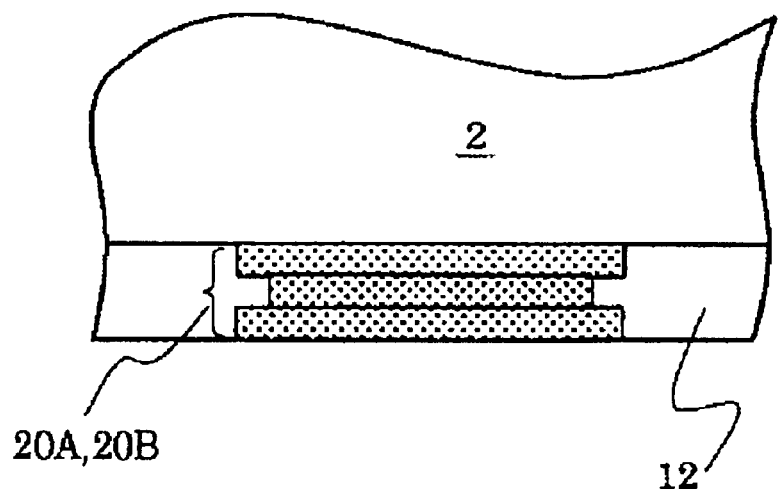

Furthermore, as shown in FIG. 3E or 3F, a multi-layered structure of three or more layers having "stepwise level difference" on the end facets to obtain a similar effect. Here again, the stepwise level difference may be a combination of depression, projection and depression in the order of the lowest layer (nearer to the semiconductor), intermediate layer and top layer (remotest from the semiconductor) as shown in FIG. 3E, or a combination of projection, depression and projection in the order of the lowest layer, intermediate layer and top layer as shown in FIG. 3F, both from the position of the resin 12.

Also when a multi-layered structure of four or more layers is employed as the electrodes 20A, 20B, the layers may be formed to be alternately projected and depressed, or vice versa.

Figure 4:
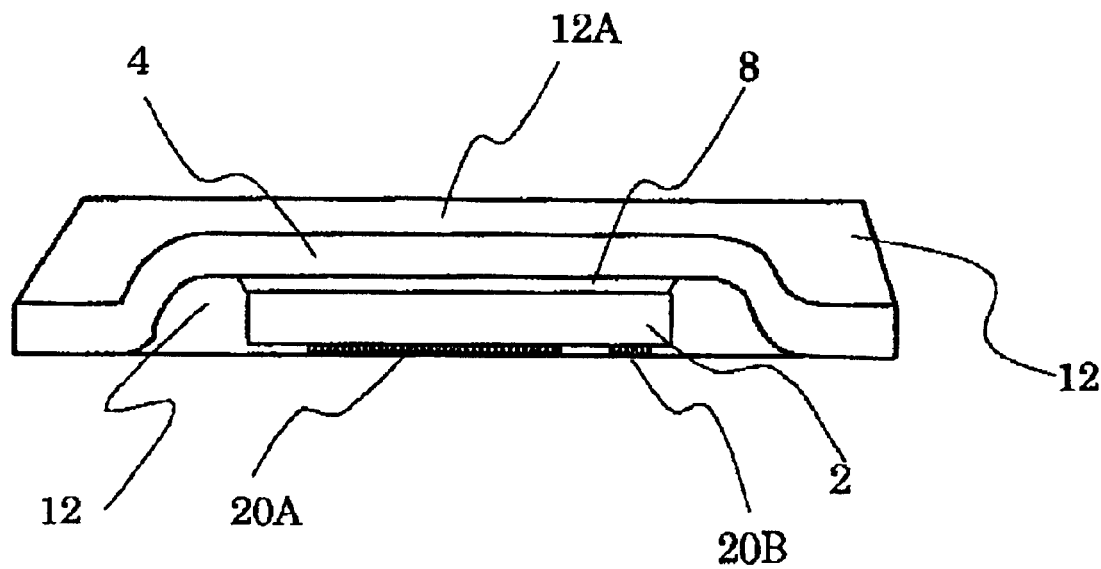
FIG. 4 is a schematic diagram showing a cross-sectional structure of a semiconductor device taken as the first modification of the embodiment.

FIG. 4 is a schematic diagram showing a cross-sectional structure of a semiconductor device taken as the first modification of the embodiment.

Figure 5:
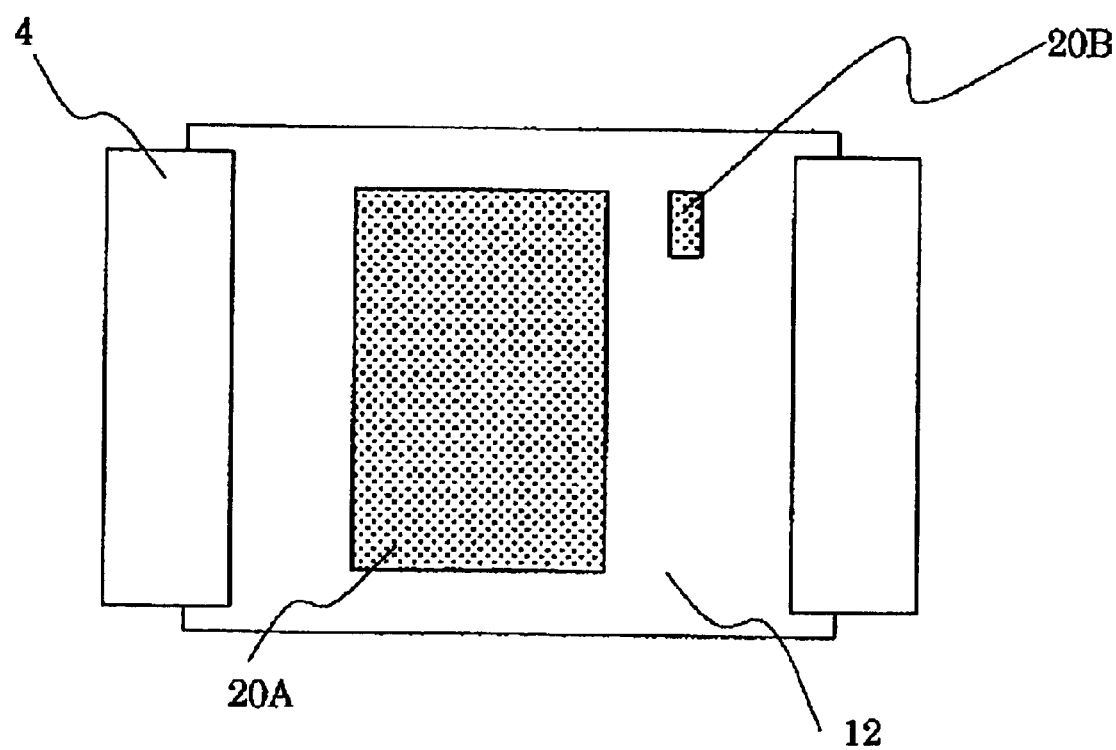
FIG. 5 is a schematic diagram of the semiconductor device of FIG. 4, viewed from its bottom.

FIG. 5 is a schematic diagram of the semiconductor device of FIG. 4, viewed from its bottom. In FIGS. 4 and 5, some of components equivalent to those already explained in conjunction with FIGS. 1 through 3 are labeled with common reference numerals, and their detailed explanation is omitted here.

This embodiment uses a continuous bottom electrode 20A not divided into a plurality of patterns. If this semiconductor device is used as the power MOSFET of FIG. 15, for example, the electrode 20A may be used as a source electrode.

The use of the single, large electrode pattern ensures reliable electrical and thermal contact, and also enhances the strength of mechanical contact thereof with the mounting substrate.

This modified example may incorporate the curved or stepwise configuration of the joint interface between the electrodes 20A, 20B and the resin 12 as shown in FIGS. 3A through 3F to improve the reliability and humidity-proof capability.

Figure 6:
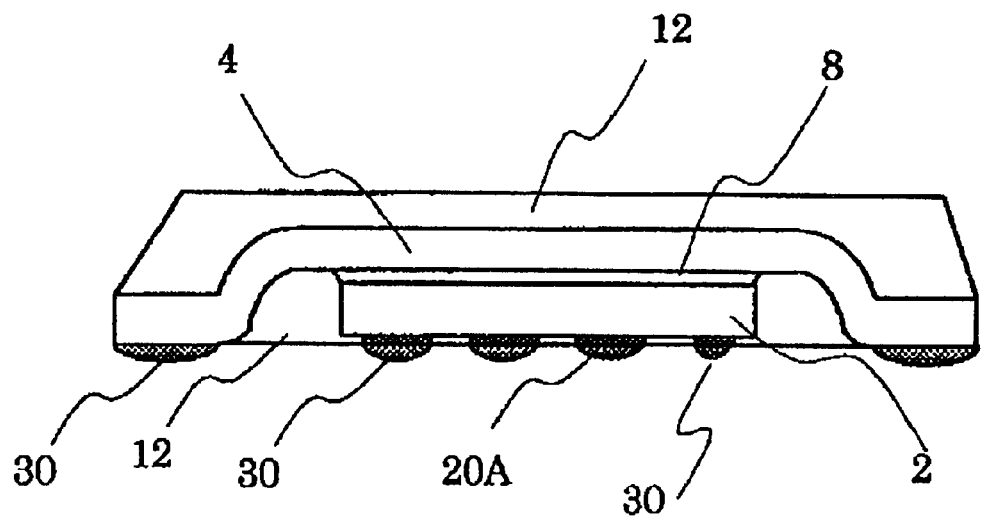
FIG. 6 is a schematic diagram showing a cross-sectional structure of a semiconductor device taken as the second modification of the embodiment.

FIG. 6 is a schematic diagram showing a cross-sectional structure of a semiconductor device taken as the second modification of the embodiment.

Figure 7:
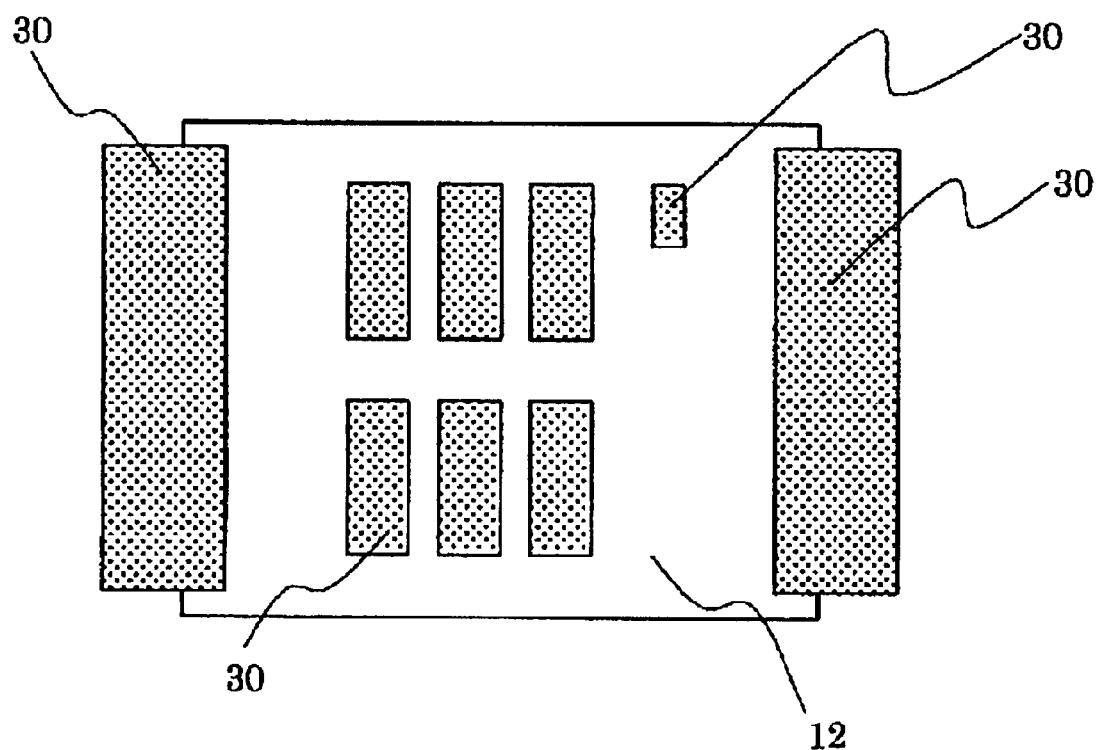
FIG. 7 is a schematic diagram of the semiconductor device of FIG. 6, viewed from its bottom.

FIG. 7 is a schematic diagram of the semiconductor device of FIG. 6, viewed from its bottom.

In FIGS. 6 and 7, some of components equivalent to those already explained in conjunction with FIGS. 1 through 5 are labeled with common reference numerals, and their detailed explanation is omitted here.

In this modified example, a solder layer 30 is formed to project from the bottom surface of the semiconductor device in locations of the exposed surfaces of the electrodes 20A, 20B and the lead frame. The solder formed beforehand facilitates connection upon mounting the semiconductor substrate to the conductor land of the mounting substrate not shown. Since the solder layer 30 melts and spreads upon packaging to the conductor land of the mounting substrate, it does not invite substantial increase of the thickness of the package.

The solder layer 30 can be made by plating or immersion plating technique.

Figure 8:
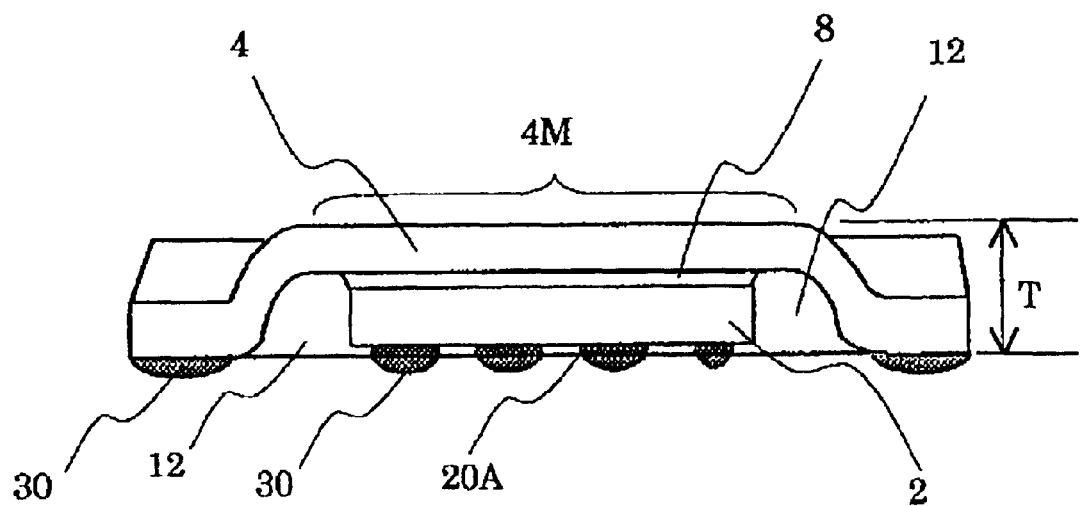
FIG. 8 is a schematic diagram showing a cross-sectional structure of a semiconductor device taken as the third modification of the embodiment.

FIG. 8 is a schematic diagram showing a cross-sectional structure of a semiconductor device taken as the third modification of the embodiment.

Figure 9:
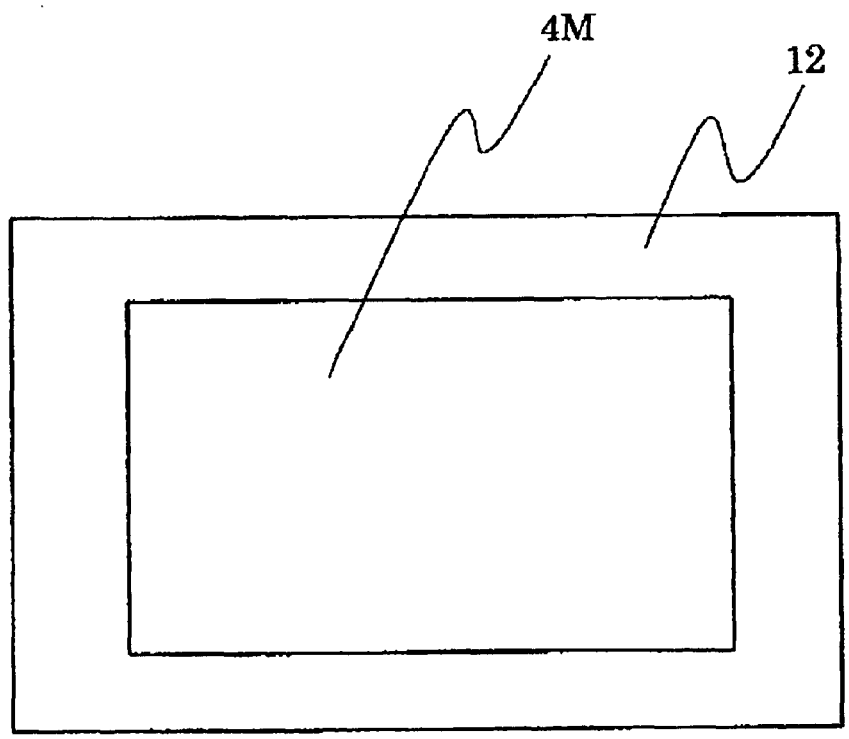
FIG. 9 is a schematic diagram of the semiconductor device of FIG. 8, viewed from its top.

FIG. 9 is a schematic diagram of the semiconductor device of FIG. 8, viewed from its top.

Also in FIGS. 8 and 9, some of components equivalent to those already explained in conjunction with FIGS. 1 through 7 are labeled with common reference numerals, and their detailed explanation is omitted here.

In this modified example, a mount portion 4M, which is a part of the lead frame 4 for mounting the semiconductor chip 2, is exposed on the top surface of the semiconductor device. Thus the resin 12 only covers the outer lead portion of the lead frame.

Then, the package thickness T becomes the total, (lead frame 4)+(bonding material 8)+(semiconductor chip 2)+(electrode 20). That is, omission of the top part of the resin contributes to further thinning. More specifically, in case a semiconductor chip such as power MOSFET of FIG. 15 or IGBT is mounted, the package thickness T can be thinned to approximately 0.4 mm.

Furthermore, exposure of the mount portion 4M of the lead frame 4 improves heat dissipation through this part. For example, if the semiconductor chip 2 is the power MOSFET shown in FIG. 15, heat generated in the chip 2 is not only dissipated into the mounting substrate through the electrodes 20A as the source electrode and the electrode B as the gate electrode, but also radiated through the mount portion 4M of the lead frame from the drain electrode. Thus the heat dissipation efficiency can be further improved. In addition, here again, since the semiconductor chip 2 is sealed by the resin 12, sufficiently high weatherproofness is ensured.

Figure 10:
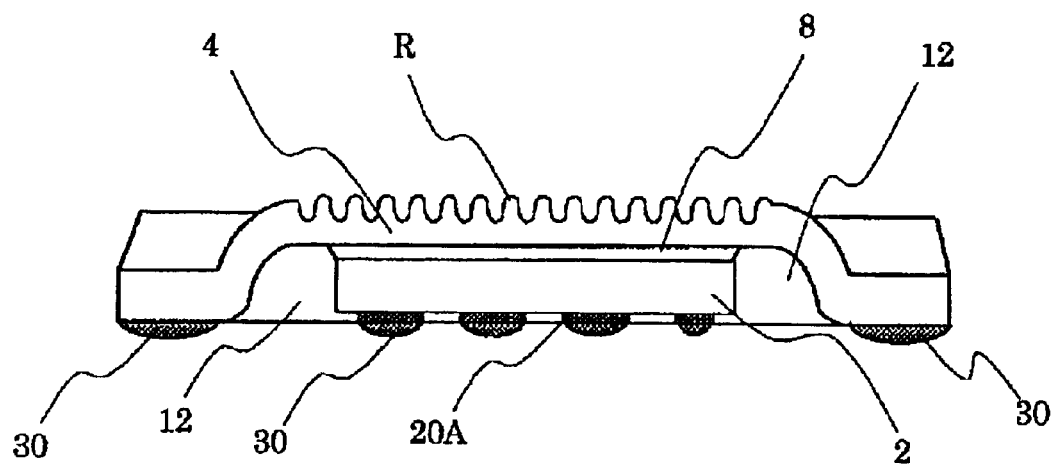
FIG. 10 is a schematic diagram showing a cross-sectional structure of a semiconductor device taken as the fourth modification of the embodiment.

FIG. 10 is a schematic diagram showing a cross-sectional structure of a semiconductor device taken as the fourth modification of the embodiment.

Also in FIG. 10, some of components equivalent to those already explained in conjunction with FIGS. 1 through 9 are labeled with common reference numerals, and their detailed explanation is omitted here.

Also in this modification, a mount portion 4M, which is a part of the lead frame 4 for mounting the semiconductor chip 2, is exposed on the top surface of the semiconductor device similarly to the third modification already explained. Additionally, the exposed mount portion 4M has a bumpy surface. For example, series of ridges R are formed on the exposed surface, as shown in FIG. 10. The ridges R function as heat radiating fins or a heat sink, and further improve the heat dissipation capability. Therefore, this modification ensures stable operation even when a semiconductor chip generating a larger quantity of heat is mounted on the semiconductor device.

Heretofore, some embodiments of the invention have been explained in conjunction with specific examples. The invention, however, is not limitative to those specific examples.

For example, with regard to concrete configurations and positional relations of the lead frame, semiconductor chip and resin, any design changes by persons skilled in the art are also involved in the scope of the invention.

The semiconductor chip is not limited power MOSFET or IGBT indicated as specific examples, and also when any of various other kinds of semiconductor elements is used, the same effects are obtained.

As described above, embodiments of the invention can provide a semiconductor device capable of efficiently radiating heat from a heat-generating portion to the mounting substrate, thinned in shape, and excellent in reliability as well. As such, the invention greatly contributes to the industry.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device of a surface-mounting type having a mount surface, comprising:
   a semiconductor chip having a first surface, a second surface, a heat-generating portion located nearer to said second surface than said first surface and generating heat during operation, and at least one patterned electrode formed on said second surface;
   a resin provided to cover said semiconductor chip; and
   an electrode terminal extracted from said first surface of said semiconductor chip,
   a mounting face of said electrode terminal and a surface of said at least one patterned electrode being exposed to be substantially flush with a plane of said mount surface, and a perimeter of said surface of said at least one patterned electrode being surrounded by said resin.

2. A semiconductor device according to claim 1, wherein a joint interface between said at least one patterned electrode and said resin has at least one of a curve and a stepwise level difference along a thickness direction of said at least one patterned electrode.

3. A semiconductor device according to claim 1, wherein said patterned electrode is a lamination of a plurality of metal layers, and an end facet of any said metal layer stays back from an end facet of another of said metal layers.

4. A semiconductor device according to claim 1, further comprising a solder layer locally formed on said mounting face of said electrode terminal and the surface of said patterned electrode.

5. A semiconductor device of a surface-mounting type having a mount surface, comprising:
   a lead frame;
   a semiconductor chip bonded to said lead frame, and having at least one electrode smaller than said semiconductor chip; and
   a resin provided to cover said semiconductor chip,
   a mounting face of said lead frame and a surface of said at least one electrode being exposed to be substantially flush with a plane of said mount surface, and a perimeter of said surface of said at least one electrode being surrounded by said resin.

6. A semiconductor device according to claim 5, wherein a heat-generating portion which generates heat during operation of said semiconductor chip is located nearer to a surface of said semiconductor chip on which said electrode is formed than a surface of said semiconductor chip on which said at least one lead frame is bonded.

7. A semiconductor device according to claim 5, wherein at least a part of a surface of said lead frame opposite from a surface thereof bonded with said semiconductor chip is exposed without being covered by said resin.

8. A semiconductor device according to claim 5, wherein said at least a part of a surface of said lead frame exposed without being covered by said resin has a bumpy surface.

9. A semiconductor device according to claim 5, wherein a joint interface between said at least one electrode and said resin has at least one of a curve and a stepwise level difference along a thickness direction of said at least one electrode.

10. A semiconductor device according to claim 5, wherein said electrode is a lamination of a plurality of metal layers, and an end facet of any said metal layer stays back from an end facet of another of said metal layers.

11. A semiconductor device according to claim 5, further comprising a solder layer locally formed on said mounting face of said lead frame and said surface of said electrode.

12. A semiconductor device comprising:
   a lead frame having a bonding portion and an electrode terminal;
   a semiconductor chip having a first surface, a second surface, and at least one patterned electrode formed on said first surface, said second surface being bonded to said bonding portion of said lead frame; and
   a resin provided to cover said semiconductor chip,
   a mounting face of said electrode terminal of said lead frame being provided to be substantially flush with a surface of said at least one patterned electrode, the surface of said at least one patterned electrode being exposed to said first surface of said semiconductor chip, and a perimeter of said surface of said at least one patterned electrode being covered by said resin.

13. A semiconductor device according to claim 12, wherein a heat-generating portion which generates heat during operation of said semiconductor chip is located nearer to said first surface than said second surface of said semiconductor chip.

14. A semiconductor device according to claim 12, wherein at least a part of a surface of said lead frame opposite from a surface thereof bonded with said semiconductor chip is exposed without being covered by said resin.

15. A semiconductor device according to claim 12, wherein said at least a part of a surface of said lead frame exposed without being covered by said resin has a bumpy surface.

16. A semiconductor device according to claim 12, wherein a joint interface between said at least one patterned electrode and said resin has at least one of a curve and a stepwise level difference along a thickness direction of said at least one patterned electrode.

17. A semiconductor device according to claim 12, wherein said patterned electrode is a lamination of a plurality of metal layers, and an end facet of any said metal layer stays back from an end facet of another of said metal layers.

18. A semiconductor device according to claim 12, further comprising a solder layer locally formed on said mounting face of said lead frame and said surface of said patterned electrode.

* * * * *